(12) United States Patent
Wang et al.

(10) Patent No.: US 12,520,541 B2
(45) Date of Patent: Jan. 6, 2026

(54) SUPER-JUNCTION DEVICE

(71) Applicant: Hangzhou Silicon-Magic Semiconductor Technology Co., Ltd., Hangzhou (CN)

(72) Inventors: Jiakun Wang, Hangzhou (CN); Lvqiang Li, Hangzhou (CN); Hui Chen, Hangzhou (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 397 days.

(21) Appl. No.: 18/176,547

(22) Filed: Mar. 1, 2023

(65) Prior Publication Data
US 2023/0282696 A1 Sep. 7, 2023

(30) Foreign Application Priority Data
Mar. 1, 2022 (CN) .......................... 202210189068.3

(51) Int. Cl.
*H10D 62/10* (2025.01)
*H10D 62/13* (2025.01)
*H10D 64/00* (2025.01)

(52) U.S. Cl.
CPC ......... *H10D 62/111* (2025.01); *H10D 62/107* (2025.01); *H10D 62/127* (2025.01); *H10D 62/157* (2025.01); *H10D 64/117* (2025.01)

(58) Field of Classification Search
CPC .. H10D 62/111; H10D 62/157; H10D 62/107; H10D 62/127; H10D 64/117

USPC ........................................................ 257/288
See application file for complete search history.

(56) References Cited

U.S. PATENT DOCUMENTS

| | | | |
|---|---|---|---|
| 9,905,636 B2 | 2/2018 | Sun et al. | |
| 10,573,712 B2 | 2/2020 | Sun et al. | |
| 2008/0315297 A1* | 12/2008 | Takashita | H10D 30/0291 257/E29.256 |

(Continued)

FOREIGN PATENT DOCUMENTS

| | | |
|---|---|---|
| CN | 104241376 A | 12/2014 |
| CN | 107482051 A | 12/2017 |
| CN | 114864654 A | 8/2022 |

*Primary Examiner* — Igwe U Anya
(74) *Attorney, Agent, or Firm* — Westman, Champlin & Koehler, P.A.

(57) ABSTRACT

Disclosed is a super-junction device, comprising a semiconductor substrate and a super-junction structure on a first surface of the semiconductor substrate. The super-junction structure includes first semiconductor pillars and second semiconductor pillars. The super-junction device has a cell region and a terminal region surrounding the cell region, the super-junction structure has a portion located in the cell region, and another portion located in the terminal region. The super-junction device further includes a guard ring located in the terminal region and surrounding the cell region, the guard ring includes doped regions extending segmentally and top-end portions of a first set of semiconductor pillars connecting the doped regions into a continuous ring. The top-end portions of the first set of semiconductor pillars in the guard ring are undoped, thus improving impurity distribution of the guard ring, charge balance in the terminal region, and voltage withstand performance of the super-junction device.

15 Claims, 5 Drawing Sheets

(56) References Cited

U.S. PATENT DOCUMENTS

| | | | |
|---|---|---|---|
| 2010/0059818 A1* | 3/2010 | Sasaki | H10D 30/0291 |
| | | | 257/E29.256 |
| 2014/0291773 A1* | 10/2014 | Lin | H10D 62/127 |
| | | | 257/409 |
| 2016/0064478 A1 | 3/2016 | Sun et al. | |
| 2018/0158900 A1 | 6/2018 | Sun et al. | |
| 2018/0204936 A1* | 7/2018 | Lee | H10D 12/441 |
| 2022/0069075 A1* | 3/2022 | Lee | H10D 30/0291 |

* cited by examiner

SUPER-JUNCTION DEVICE

CROSS-REFERENCE TO RELATED APPLICATIONS

The present application claims priority to a Chinese patent application No. 202210189068.3, filed with the China National Intellectual Property Administration on Mar. 1, 2022, entitled "Super-Junction Device", which is incorporated herein by reference in its entirety.

FIELD OF TECHNOLOGY

The present disclosure relates to a technical field of semiconductor devices, in particular to a super-junction device.

BACKGROUND

Super-junction devices are an important type of power device. In a super-junction device, P-type semiconductor pillars and N-type semiconductor pillars are alternately arranged in a lightly doped drift region of a MOS (Metal Oxide Semiconductor) transistor, and PN junctions are each formed between a corresponding one of the P-type semiconductor pillars and a corresponding one of the N-type semiconductor pillars. When the super-junction device is operated in turn-on state, a conductive path is provided by the N-type semiconductor pillars, and an on-resistance can be reduced by use of the N-type semiconductor pillars with high doping concentration. When the super-junction device is operated in off state, the P-type semiconductor pillars and the N-type semiconductor pillars withstand a reverse bias voltage together. A transverse local electric field is formed between a P-type semiconductor pillar and an N-type semiconductor pillar. Due to transverse termination of charge electric line of force, the whole drift region is approximate to an intrinsic layer in a longitudinal direction of a withstand voltage, thus longitudinal electric field can be modulated, longitudinal electric field distribution can be optimized, and a breakdown voltage of the MOS transistor can be improved based on charge balance principle. Therefore, the super-junction device can meet both demands on the on-resistance and the breakdown voltage of the MOS transistor.

Since an area of an actual super-junction device is limited, the periodic arrangement of the super-junction structure will be interrupted at a boundary of a cell region, and charge imbalance may occur in an edge cell of the cell region under reverse bias state, which may lead to premature breakdown of the device. Therefore, in an actual super-junction device, a terminal region is formed around the cell region, and a guard ring is formed in the terminal region, so that edge electric-field distribution of the cell region can be optimized and a normal withstand voltage of the cell region can be ensured. The guard ring is, for example, a P-type doped region formed by continuously doping top-end portions of the P-type semiconductor pillars and the N-type semiconductor pillars, and because the guard ring is a P-type doped region which is heavily doped, in the terminal region, a region of the P-type semiconductor pillars which is adjacent to and below a corresponding one of the doped regions may be over-doped and a region of the N-type semiconductor pillars which is adjacent to and below a corresponding one of the doped regions may be is under-doped, thus charge balance between the P-type semiconductor pillars and the N-type semiconductor pillars may be destroyed, which may still lead to premature breakdown of the super-junction device.

Therefore, it is expected to further optimize the structure of the terminal region of the super-junction device to ensure a normal withstand voltage of the terminal region, so as to improve voltage-withstand reliability of the super-junction device.

SUMMARY

In view of the above problems, an objective of the present disclosure is to provide a super-junction device wherein a cell region is surrounded by a terminal region, and a guard ring in the terminal region includes doped regions which extend segmentally and an undoped semiconductor pillar between adjacent ones of the doped regions, so that impurity distribution of the guard ring and charge balance in the terminal region can be improved.

According to an aspect of the present disclosure, a super-junction device is provided and comprises: a semiconductor substrate; and a super-junction structure which is located on a first surface of the semiconductor substrate, and comprises a plurality of first semiconductor pillars and a plurality of second semiconductor pillars, wherein the plurality of first semiconductor pillars and the plurality of second semiconductor pillars are alternately arranged on the first surface, each one of the plurality of first semiconductor pillars, which is adjacent to a corresponding one of the plurality of second semiconductor pillars, is in contact with that corresponding one of the plurality of second semiconductor pillars and form a PN junction with that corresponding one of the plurality of second semiconductor pillars, a dopant type of the plurality of first semiconductor pillars is opposite to a dopant type of the plurality of second semiconductor pillars, wherein the super-junction device has a cell region and a terminal region surrounding the cell region, the super-junction structure has a portion located in the cell region and another portion located in the terminal region, and the super-junction device further comprises a guard ring, which is located in the terminal region, surrounds the cell region, and comprises a plurality of doped regions extending segmentally and top-end portions of a first set of semiconductor pillars which connect the plurality of doped regions into a continuous ring.

In some embodiments, the plurality of doped regions are located at top-end portions of a second set of semiconductor pillars, respectively, and adjacent doped regions of the plurality of doped regions are both in contact with a corresponding one of the first set of semiconductor pillars.

In some embodiments, the first set of semiconductor pillars are selected from the plurality of first semiconductor pillars and the second set of semiconductor pillars are selected from the plurality of second semiconductor pillars.

In some embodiments, the plurality of first semiconductor pillars and the plurality of second semiconductor pillars each extend in parallel along a first direction and are alternately arranged in a second direction.

In some embodiments, a width of the guard ring in the first direction corresponds to a doped-region length, along the first direction, of a corresponding one of the plurality of doped regions.

In some embodiments, a width of the guard ring in the second direction corresponds to a sum of a doped-region width of a corresponding one of the plurality of doped regions in the second direction, and a width of one of the plurality of first semiconductor pillars that is in contact with that corresponding one of the plurality of doped regions.

In some embodiments, in the cell region, the super-junction device further comprises a body region located at top of a corresponding one of the plurality of first semiconductor pillars, and a source region located in the body region.

In some embodiments, a junction depth of the plurality of doped regions is consistent with a junction depth of the body region.

In some embodiments, the guard ring comprises a plurality of sub-rings, each of which comprises: a plurality of doped regions extending segmentally, and a top-end portion of a semiconductor pillar in the first set of semiconductor pillars which connects the plurality of doped regions into a continuous ring.

In some embodiments, the plurality of sub-rings are separated from each other by undoped regions of the second set of semiconductor pillars.

In some embodiments, a spacing between adjacent ones of the plurality of sub-rings increases correspondingly with a distance from the adjacent ones of the plurality of sub-rings to an edge of the cell region.

In some embodiments, the semiconductor substrate, the plurality of second semiconductor pillars, and the source region are respectively of a first dopant type, and the plurality of first semiconductor pillars, the body region, and the plurality of doping regions are respectively of a second dopant type.

In some embodiments, the first dopant type is N type and the second dopant type is P type.

In a super-junction device according to an embodiment of the present disclosure, a cell region is surrounded by a terminal region, and a guard ring in the terminal region includes a plurality of doped regions extending segmentally, and an undoped semiconductor pillar between adjacent ones of the plurality of doped regions. On one hand, the guard ring is still a semiconductor ring of a single dopant type which extends continuously, thus optimizing the edge electric-field distribution in the cell region. On the other hand, the guard ring includes the plurality of doping regions that are segmentally doped, wherein only top-end portions of the second semiconductor pillars are heavily doped, so that the top-end portions of the second semiconductor pillar are reversely doped, and top-end portions of the first semiconductor pillars are undoped as a whole. Therefore, in the terminal region, charge balance between adjacent semiconductor pillars can be improved in a region adjacent to and below a corresponding one of the doped regions, which is beneficial to improving voltage withstand reliability of the terminal region in the super-junction device.

In some embodiments, a junction depth of the doped regions of the guard ring formed in the terminal region is consistent with that of the body region formed in the cell region, and may be shallow. Therefore, between the cell region and the terminal region, charge balance between adjacent semiconductor pillars can be improved in the region adjacent to and below a corresponding one of the doped regions, and an overall voltage withstand reliability of the cell region and the terminal region in the super-junction device can be improved.

BRIEF DESCRIPTION OF THE DRAWINGS

The above and other objects, features and advantages of the present invention will become more apparent from the description below with reference to the accompanying drawings, in which.

DESCRIPTION OF THE EMBODIMENTS

Figure 1A:
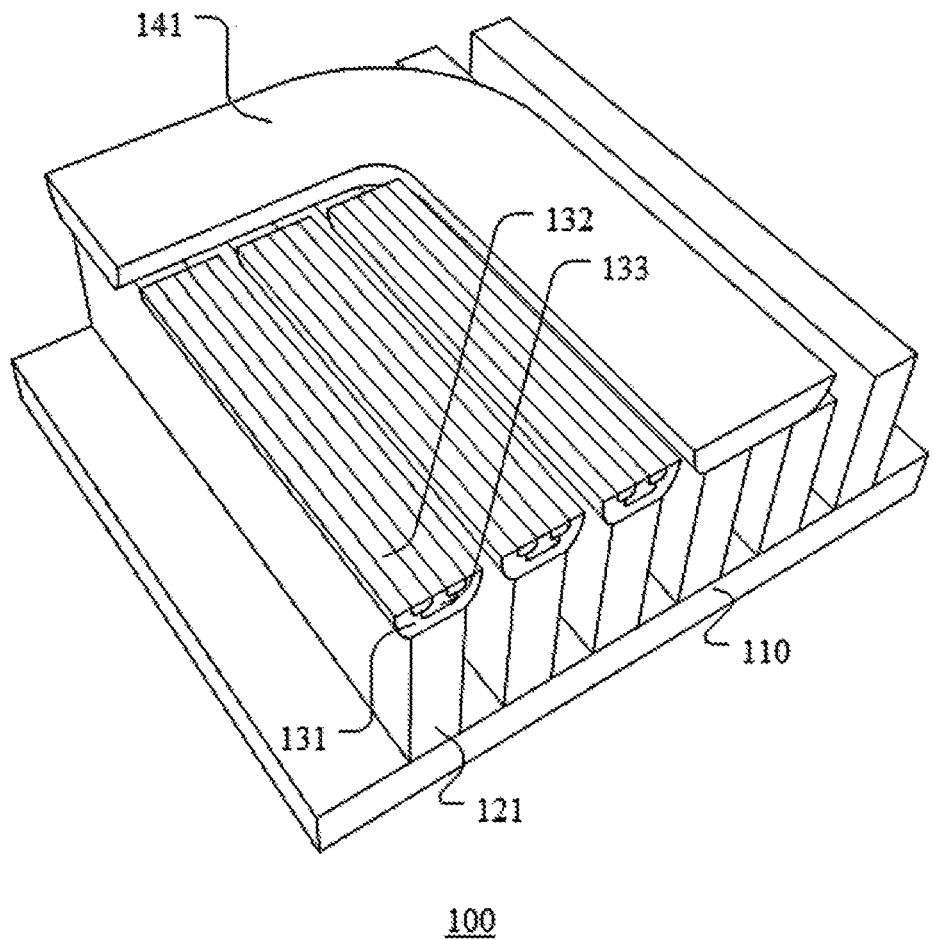
FIGS. 1a and 1b respectively show a perspective schematic view and a top schematic view of a portion of a structure of a super-junction device.

Various embodiments of the present disclosure will be described in more detail below with reference to the accompanying drawings. Throughout the various figures, like elements are denoted by the same or similar reference numerals. For the sake of clarity, various parts in the drawings are not drawn to scale.

In the present disclosure, the term "semiconductor structure" refers to a generic designation of an entire semiconductor structure formed in the various steps of manufacturing a device, including all layers and/or regions that have been formed. Many specific details of the present disclosure, such as a structure, a material, a dimension, a processing process and a technique of the device, are described below, so that the present disclosure can be clearly understood. However, as will be understood by those skilled in the art, the present disclosure may be achieved without these specific details.

Further, it should be noted that relational terms such as "first" and "second" are used herein only to distinguish one entity or operation from another entity or operation and do not necessarily require or imply any such actual relationship or order between these entities or operations. Furthermore, the terms "including", "comprising" or any other variation thereof are intended to encompass non-exclusive inclusion, so that a process, method, article or equipment that includes a set of elements includes not only those elements but also other element that are not explicitly listed, or also elements inherent to such a process, method, article or equipment. In the absence of more restrictions, an element limited by a statement containing "includes/comprises a . . . " does not preclude an existence of another identical element in the process, method, article or equipment that includes said element.

Figure 1B:
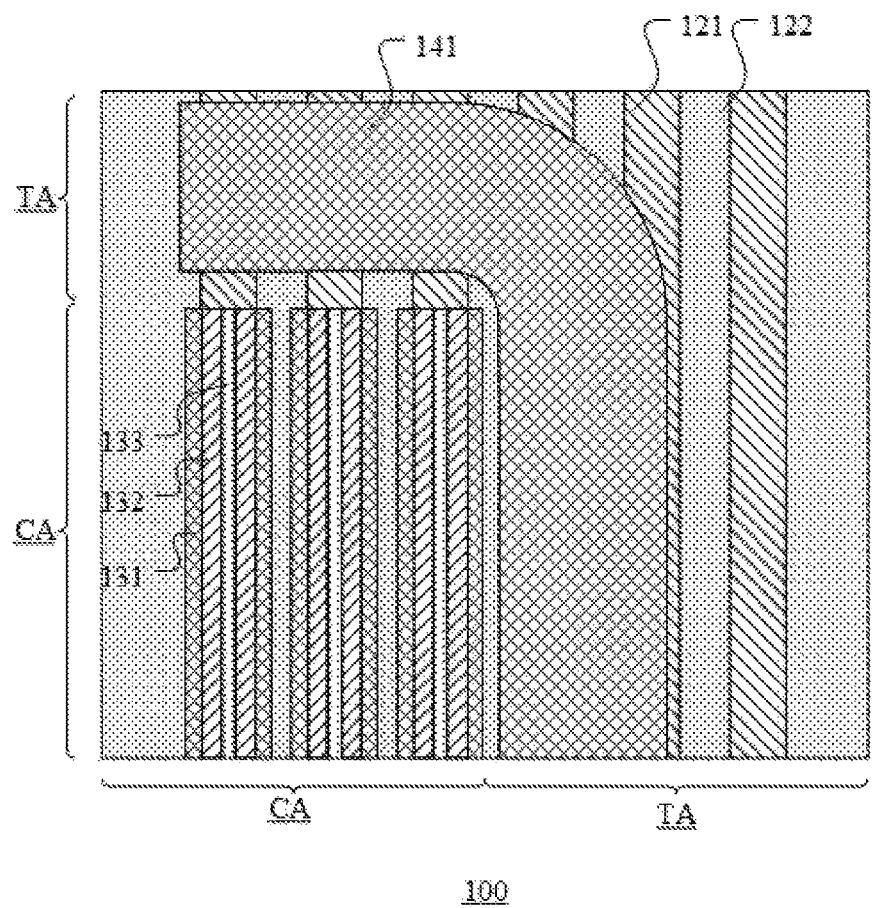

FIGS. 1a and 1b respectively show a perspective schematic view and a top schematic view of a portion of a structure of a super-junction device. For the sake of clarity, only a main semiconductor structure is shown in FIGS. 1a and 1b, and some other structures, such as an interlayer insulating layer, an interconnection structure, a gate stack structure and an electrode structure, are not shown.

As shown in FIGS. 1a and 1b, the super-junction device 100 includes a semiconductor substrate 110, and a plurality of first semiconductor pillars 121 and a plurality of second semiconductor pillars 122 located on the semiconductor substrate 110. For clarity, only the plurality of first semiconductor pillars 121 are shown in FIG. 1a, and the plurality of second semiconductor pillars 122 are not shown. The semiconductor substrate 110 includes, for example, a heavily doped N-type silicon substrate. Relative to the semiconductor substrate 110, the first semiconductor pillars 121 are formed by a lightly doped P-type epitaxial layer, and the second semiconductor pillars 122 are formed by a lightly doped N-type epitaxial layer. The plurality of first semiconductor pillars 121 and the plurality of second semiconductor pillars 122 are alternately arranged, each one of the plurality of first semiconductor pillars 121, which is adjacent to a corresponding one of the plurality of second semiconductor pillars 122, is in contact with that corresponding one of the plurality of second semiconductor pillars 122 and form a PN junction with that corresponding one of the plurality of second semiconductor pillars 122.

Further, referring to the top schematic view shown in FIG. 1*b*, a device area of the super-junction device 100 is divided into a cell region CA and a terminal region TA surrounding the cell region CA. In the plurality of first semiconductor pillars 121 and the plurality of second semiconductor pillars 122 located on the semiconductor substrate 110, one set of semiconductor pillars are located in the cell region CA, and another set of semiconductor pillars are located in the terminal region TA. For clarity, FIG. 1*b* shows only a portion of the cell region CA and the terminal region TA. It should be understood that, in a complete device structure, the terminal region TA may form, for example, a closed region surrounding the cell region CA.

Further, referring to the perspective schematic view shown in FIG. 1*a*, in the cell region CA, a body region 131 is formed at top end of a corresponding first semiconductor pillar 121 and a source region 132 is formed in the body region 131. The body region 131 and the source region 132 may be formed by performing processes including ion implantation and thermal annealing. The body region 131 is, for example, a P-type doped region, and the source region 132 is, for example, an N-type doped region. The body region 131 extends laterally into a corresponding one of the plurality of second semiconductor pillars 122 which is adjacent to that body region 131, and the source region 132 is located in the body region 131. In some embodiments, a plurality of source regions 132 may be formed in the body region 131, and a contact region 133 may be formed between adjacent ones of the plurality of source regions 132. The contact region 133 is, for example, a P-type doped region which is heavily doped, relative to the body region 131. The contact region 133 is used to form ohmic contact between a source metal and the body region, to ensure that the source regions and the body region have equal voltage potential, and to prevent a parasitic transistor from being turned on.

Further, referring to the perspective schematic view shown in FIG. 1*a*, in the terminal area TA, a guard ring 141 is formed. The guard ring 141 is a continuously doped region surrounding the cell region CA. The guard ring 141 and the body region 131 are of same dopant type, for example, both the guard ring 141 and the body region 131 are P-type doped regions. The continuously doped region of the guard ring 141 includes top-end portions of corresponding first semiconductor pillars 121 and top-end portions of corresponding second semiconductor pillars 122. The guard ring 141 may be formed by performing processes including ion implantation and thermal annealing. Since the dopant type of the guard ring 141 is the same as that of the plurality of first semiconductor pillars 121 and is opposite to that of the plurality of second semiconductor pillars 122, in the process of forming the guard ring 141, the top-end portions of the corresponding first semiconductor pillars 121 in the terminal region TA are over-doped, and the top-end portions of the corresponding second semiconductor pillars 122 are compensatorily doped into P type from N type.

Due to electric-field distribution characteristics of the super-junction device, periodic arrangement of the cell region is terminated in the terminal region, and electric field concentration may occur in the terminal region under reverse bias state, which may easily lead to premature breakdown and sharp reduction of a withstand voltage. The super-junction device includes a terminal region surrounding the cell region, and the guard ring is formed in the terminal region, so as to optimize edge electric-field distribution of the cell region. The guard ring is, for example, a P-type doped region formed by doping the top-end portions of corresponding P-type semiconductor pillars and corresponding N-type semiconductor pillars.

Figure 2A:
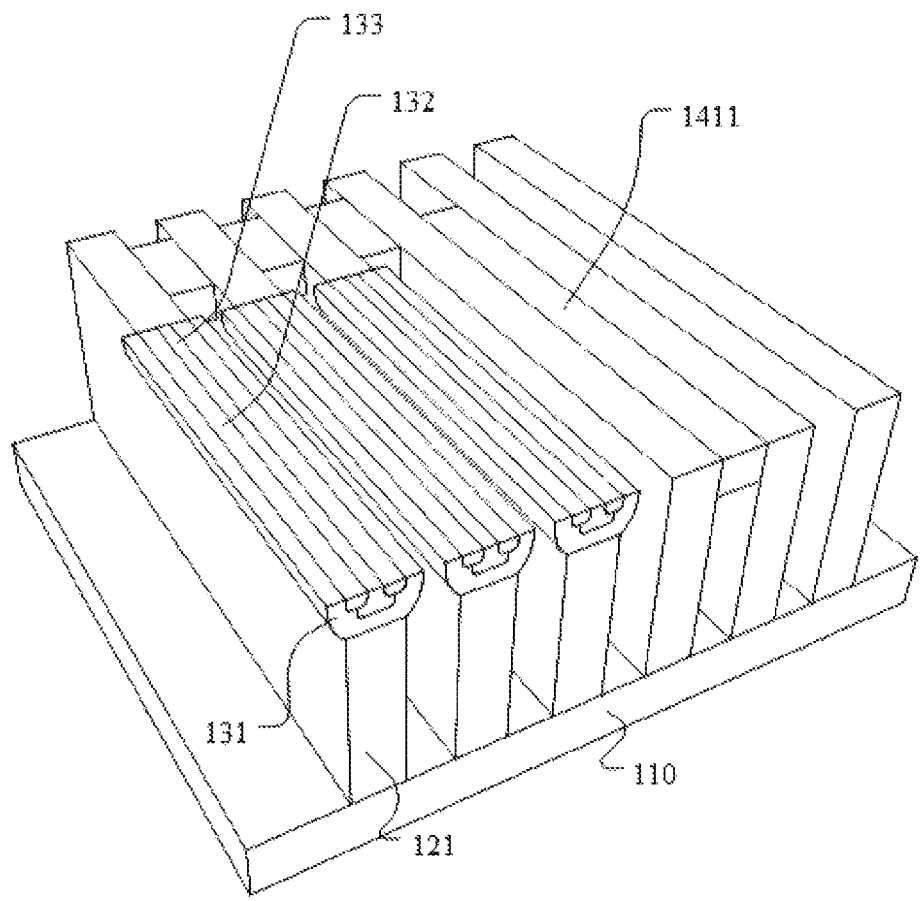
FIG. 2a, FIG. 2b and FIG. 2c respectively show a perspective schematic top view, a top schematic view and a cross-sectional schematic view of a portion of a structure of a super-junction device according to an embodiment of the present disclosure.
Figure 2B:
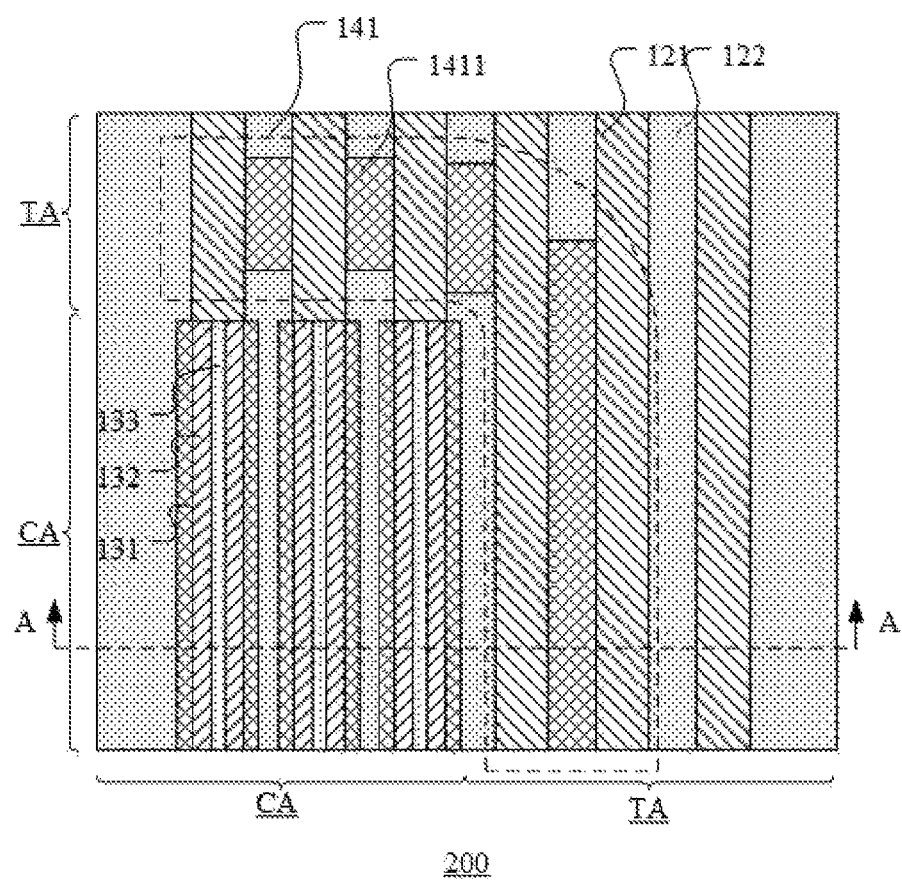
Figure 2C:
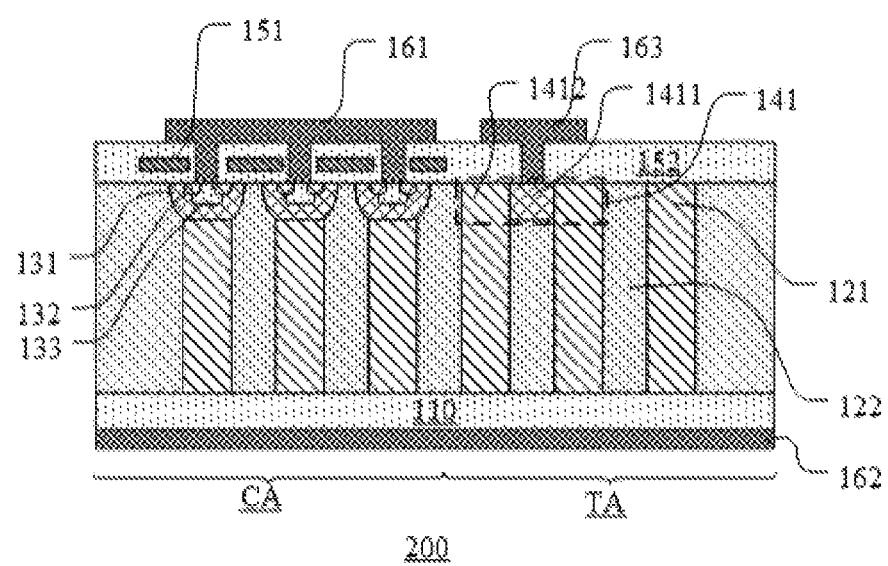

FIG. 2*a*, FIG. 2*b* and FIG. 2*c* respectively show a perspective schematic top view and a cross-sectional schematic view of a portion of a structure of a super-junction device according to an embodiment of the present disclosure. For the sake of clarity, only a main semiconductor structure is shown in FIGS. 2*a* and 2*b*, and some other structures, such as an interlayer, an insulating layer, an interconnection structure, a gate stack structure and an electrode structure, are not shown.

As shown in FIGS. 2*a*, 2*b* and 2*c*, the super-junction device 200 includes a semiconductor substrate 110, and a plurality of first semiconductor pillars 121 and a plurality of second semiconductor pillars 122 located on the semiconductor substrate 110. For clarity, only the first semiconductor pillars 121 are shown in FIG. 2*a*, and the second semiconductor pillars 122 are not shown. The semiconductor substrate 110 is, for example, a heavily doped N-type silicon substrate. Relative to the semiconductor substrate 110, the first semiconductor pillars 121 are, for example, lightly doped P-type pillars, and the second semiconductor pillars 122 are, for example, lightly doped N-type pillars. The plurality of first semiconductor pillars 121 and the plurality of second semiconductor pillars 122 are alternately arranged, each one of the plurality of first semiconductor pillars 121, which is adjacent to a corresponding one of the plurality of second semiconductor pillars 122, is in contact with that corresponding one of the plurality of second semiconductor pillars 122 and form a PN junction with that corresponding one of the plurality of second semiconductor pillars 122.

Hereinafter, the plurality of first semiconductor pillars 121 and the plurality of second semiconductor pillars 122 together herein are referred to as a "super-junction structure".

Processes for forming the plurality of first semiconductor pillars 121 and the plurality of second semiconductor pillars 122, which are described above, may be already known. In a process, an N-type epitaxial layer may be formed on the semiconductor substrate 110, and then P-type doping ions may be implanted into the N-type epitaxial layer to form a plurality of P-type doped regions which are arranged periodically, thereby forming the plurality of first semiconductor pillars 121. The plurality of second semiconductor pillars 122 may be each formed by a portion, which is located between adjacent first semiconductor pillars 121, of the N-type epitaxial layer. In another process, an N-type epitaxial layer may be formed on the semiconductor substrate 110, and then a plurality of deep trenches may be formed by etching, and then a P-type epitaxial layer may be filled in each of the deep trenches by performing epitaxial growth for multiple times, and the plurality of first semiconductor pillars 121 may be formed by the P-type epitaxial layers in the plurality of deep trenches. The plurality of second semiconductor pillars 122 may be formed by a portion, which is located between adjacent first semiconductor pillars 121, of the N-type epitaxial layer.

Further, referring to the top schematic view shown in FIG. 2*b*, the device region of the super-junction device 200 is divided into a cell region CA and a terminal region TA surrounding the cell region CA. In the plurality of first semiconductor pillars 121 and the plurality of second semiconductor pillars 122 on the semiconductor substrate 110, one set of semiconductor pillars are located in the cell region CA, and another set of semiconductor pillars are located in the terminal region TA. For clarity, FIG. 2b only shows a portion of the cell region CA and the terminal region TA. It should be understood that, in a complete device structure, the terminal region TA may form, for example, a closed region surrounding the cell region CA.

Further, referring to the perspective schematic view shown in FIG. 2a, in the cell region CA, a body region 131 is formed at top end of a corresponding first semiconductor pillar 121 and a source region 132 is formed in the body region 131. The body region 131 and the source region 132 are formed by processes, including ion implantation and thermal annealing. The body region 131 is, for example, a P-type doped region, and the source region 132 is, for example, an N-type doped region. The body region 131 extends laterally into a corresponding second semiconductor pillar 122 which is adjacent to that body region, and the source region 132 is located in the body region 131. In some embodiments, a plurality of source regions 132 may be formed in the body region 131 and a contact region 133 may be formed between adjacent ones of the plurality of source regions 132. The contact region 133 is used to form ohmic contact between a source metal and the body region, to ensure that the source regions and the body region have equal voltage potential, so as to prevent a parasitic transistor from being turned on.

Further, referring to the perspective schematic view shown in FIG. 2a, in the terminal region TA, a guard ring 141 is formed, and the cell region CA is surrounded by the guard ring 141. The guard ring 141 includes a plurality of doped regions 1411 extending segmentally, and top-end portions 1412 of the first semiconductor pillars 121, each of which is located between adjacent ones of the plurality of doped regions 1411. The plurality of doped regions 1411 and the body region 131 have a same dopant type, for example, the plurality of doped regions 1411 and the body region 131 are P-type doped regions.

The doped regions 1411 of the guard ring 141 may be formed by processes including ion implantation and thermal annealing. Different from the process of forming the guard ring 141 in the prior art, in the super-junction device 200 according to embodiments of the present disclosure, only a top-end portion of each corresponding second semiconductor pillar 122 is heavily doped in a process of forming the doped regions 1411 of the guard ring 141, so that the top-end portion of each corresponding second semiconductor pillar 122 is compensatorily doped into P type from N type. Due to diffusion effect of thermal annealing, one or more of the doped regions 1411 may each extend laterally into a top-end portion of a corresponding first semiconductor pillar 121. The top-end portions of corresponding first semiconductor pillars 121 are each not over-doped as a whole, thus charge balance between the P-type semiconductor pillars and the N-type semiconductor pillars can still be maintained in a region adjacent to and below a corresponding one of the doped regions, which can further prevent premature breakdown of the terminal region and ensure a normal withstand voltage of the cell region and the terminal region in the device. Since the doped regions 1411 is each in contact with the top-end portion 1412 of a corresponding first semiconductor pillar 121, the continuous P-type doped guard ring 141 can be formed by the doped regions 1411 together with the top-end portions 1412 of the corresponding first semiconductor pillars 121.

In some embodiments, the plurality of first semiconductor pillars 121 and the plurality of second semiconductor pillars 122 each extend in parallel in a first direction and are alternately arranged in a second direction. In the terminal region TA, a width of the guard ring 141 in the first direction is equal to a length of the plurality of doped regions 1411 in the first direction, and a width of the guard ring 141 in the second direction is equal to a sum of widths of the doped regions 1411 and widths of corresponding first semiconductor pillars 121, each of which is in contact with a corresponding one of the doped regions 1411.

The top schematic view shown in FIG. 2b and the cross-sectional schematic view shown in FIG. 2c can be referred to in the embodiments. Line AA in FIG. 2b shows an interception position corresponding to FIG. 2c in which a more detailed structure of the super-junction device 200 is shown.

Further, the super-junction device 200 further includes a gate stack which is located on the body region 131, and includes, for example, a gate conductor 151 and a gate dielectric (shown as a portion of an interlayer dielectric layer 152 in FIG. 2c) located on the body region 131. The gate conductor 151, for example, extends laterally from an edge of the source region 132 to a position over a corresponding second semiconductor pillar 122. The gate dielectric is, for example, a silicon oxide layer with a thickness of 10-50 nm, and the gate conductor 151 is, for example, a polysilicon layer with a thickness of 600-1000 nm.

Further, the super-junction device 200 also includes an interlayer dielectric layer 152 covering the gate stack and the super-junction structure, a source electrode 161 and a terminal electrode 163 on the interlayer dielectric layer 152, and a drain electrode 162 on a surface of the semiconductor substrate 101 opposite to the super-junction structure. The interlayer insulating layer 152 may be, for example, made of silicon oxide, silicon nitride or other well-known insulating material. The source electrode 161, the drain electrode 162, and the terminal electrode 163 may be, for example, made of any one or alloy of gold, silver, copper, aluminum, and tungsten. The source electrode 161 is connected to the source region 131 via a conductive channel penetrating through the interlayer dielectric layer 152, and the terminal electrode 163 is connected to a corresponding doped region 1411 of the guard ring 141 via a conductive channel penetrating through the interlayer dielectric layer 152. In this embodiment, the semiconductor substrate 110 also serves as a drain region, and the drain electrode 162 is in direct contact with the semiconductor substrate 110.

In the above-described embodiment, a case where a guard ring formed in the terminal region of the super-junction device includes a single sub-ring has been described. In some embodiments, in the terminal region of the super-junction device, adjacent doped regions of the plurality of doped regions are both in contact with a corresponding one of the first semiconductor pillars in the first set of semiconductor pillars, so that a plurality of sub-rings can be formed and separated from each other by undoped second semiconductor pillars in the second set of semiconductor pillars. Further, in some embodiments, the number of undoped second semiconducting pillar(s) between adjacent sub-rings of the plurality of sub-rings increases with a distance from those adjacent sub-rings to an edge of the cell region, so that a spacing between adjacent sub-rings increases correspondingly.

The embodiments in accordance with the present disclosure, as described above, are not described in detail, and are not intended to limit the present invention to be only the described particular embodiments. Obviously, many modifications and variations are possible in light of the above. These embodiments have been chosen and described in detail by the specification to explain the principles and embodiments of the present invention so that those skilled in the art can make good use of the present invention and the modified use based on the present disclosure. The invention is to be limited only by the scope of the appended claims and the appended claims and equivalents thereof

What is claimed is:

1. A super-junction device, comprising:
a semiconductor substrate; and
a super-junction structure, which is located on a first surface of the semiconductor substrate, and comprises a plurality of first semiconductor pillars and a plurality of second semiconductor pillars, wherein the plurality of first semiconductor pillars and the plurality of second semiconductor pillars are alternately arranged on the first surface, each one of the plurality of first semiconductor pillars, which is adjacent to a corresponding one of the plurality of second semiconductor pillars, is in contact with that corresponding one of the plurality of second semiconductor pillars and form a PN junction with that corresponding one of the plurality of second semiconductor pillars, a dopant type of the plurality of first semiconductor pillars is opposite to a dopant type of the plurality of second semiconductor pillars,
wherein the super-junction device has a cell region and a terminal region surrounding the cell region, a portion of the super-junction structure is located in the cell region and another portion of the super-junction structure is located in the terminal region, the super-junction device further comprises a guard ring which is located in the terminal region and surrounds the cell region,
the guard ring comprises a plurality of doped regions extending segmentally, and top-end portions of a first set of semiconductor pillars which connect the plurality of doped regions into a continuous ring,
wherein the guard ring is in direct contact with a terminal electrode located in the terminal region.

2. The super-junction device according to claim 1, wherein the plurality of doped regions are located at top-end portions of a second set of semiconductor pillars, respectively, and adjacent doped regions of the plurality of doped regions are both in contact with a corresponding one of the first set of semiconductor pillars.

3. The super-junction device according to claim 2, wherein the first set of semiconductor pillars are selected from the plurality of first semiconductor pillars, and the second set of semiconductor pillars are selected from the plurality of second semiconductor pillars.

4. The super-junction device according to claim 3, wherein the plurality of first semiconductor pillars and the plurality of second semi-conductor pillars each extend in parallel along a first direction and are alternately arranged in a second direction.

5. The super-junction device according to claim 4, wherein a width of the guard ring in the first direction corresponds to a doped-region length, along the first direction, of a corresponding one of the plurality of doped regions.

6. The super-junction device according to claim 4, wherein a width of the guard ring in the second direction corresponds to a sum of a doped-region width of a corresponding one of the plurality of doped regions in the second direction and widths of corresponding semiconductor pillars of the plurality of first semiconductor pillars that are in contact with that corresponding one of the plurality of doped regions.

7. The super-junction device according to claim 2, wherein, in the cell region, the super-junction device further includes a body region located at top of a corresponding one of the plurality of first semiconductor pillars, and a source region located in the body region.

8. The super-junction device according to claim 7, wherein a junction depth of the plurality of doped regions is consistent with a junction depth of the body region.

9. The super-junction device according to claim 7, wherein the semiconductor substrate, the plurality of second semiconductor pillars, and the source region are respectively of a first dopant type, and the plurality of first semiconductor pillars, the body region, and the plurality of doping regions are respectively of a second dopant type.

10. The super-junction device according to claim 9, wherein the first dopant type is N type and the second dopant type is P type.

11. The super-junction device according to claim 2, wherein the guard ring comprises a plurality of sub-rings, each of which comprises: a plurality of doped regions extending segmentally, and a top-end portion of a semiconductor pillar in the first set of semiconductor pillars which connects the plurality of doped regions into a continuous ring.

12. The super-junction device according to claim 11, wherein the plurality of sub-rings are separated from each other by undoped regions of the second set of semiconductor pillars.

13. The super-junction device according to claim 12, wherein a spacing between adjacent ones of the plurality of sub-rings increases correspondingly with a distance from the adjacent ones of the plurality of sub-rings to an edge of the cell region.

14. The super-junction device according to claim 1, wherein in the guard ring: the top-end portions of the first set of semiconductor pillars are each at least partially presented from being doped by an implantation process for forming the plurality of doped regions, thus a dopant concentration in the top-end portions of the first set of semiconductor pillars are each exhibit a decreasing gradient from an edge in contact to an adjacent one of the plurality of doped regions toward a central region farther away from that adjacent one of the plurality of doped regions.

15. The super-junction device according to claim 1, wherein in the terminal region, the terminal electrode is electrically is connected to a corresponding one of the plurality of doped regions in the guard ring via a conductive channel penetrating through an interlayer dielectric layer, which has a bottom surface in direct contact with an upper surface of the guard ring, and the terminal electrode is different from a source electrode of the super-junction device.

* * * * *